(12) United States Patent
Otsuki et al.

(10) Patent No.: US 6,450,821 B2
(45) Date of Patent: Sep. 17, 2002

(54) ELECTRICAL CONNECTORS ADAPTED TO REDUCE OR PREVENT ADHERENCE OF CONDUCTIVE MATERIAL TO CONTACT PORTIONS AS THE CONNECTOR

(75) Inventors: Tomonari Otsuki; Yasue Yamazaki, both of Tokyo (JP)

(73) Assignee: DDK Ltd., Tokyo (JP)

(*) Notice: Subject to any disclaimer, the term of this patent is extended or adjusted under 35 U.S.C. 154(b) by 0 days.

(21) Appl. No.: 09/801,541

(22) Filed: Mar. 8, 2001

(30) Foreign Application Priority Data

Mar. 9, 2000 (JP) .................................... 2000-064241

(51) Int. Cl.7 .............................................. H01R 12/00
(52) U.S. Cl. ............................. 439/70; 439/65; 439/66
(58) Field of Search .............................. 439/70, 71, 66, 439/72, 65

(56) References Cited

U.S. PATENT DOCUMENTS

| | | | | |
|---|---|---|---|---|
| 5,163,834 A | * | 11/1992 | Chapin et al. | 439/66 |
| 5,759,047 A | * | 6/1998 | Brodsky et al. | 439/66 |
| 5,984,691 A | * | 11/1999 | Brodsky et al. | 439/66 |
| 6,010,340 A | * | 1/2000 | Campbell et al. | 439/71 |
| 6,224,396 B1 | * | 5/2001 | Chan et al. | 439/66 |

\* cited by examiner

*Primary Examiner*—Tho D. Ta
(74) *Attorney, Agent, or Firm*—Baker Botts L.L.P.

(57) ABSTRACT

An electrical connector includes a first connector having a connector plate and a plurality of electric contacts thereon, and a second connector having a plurality of electric contact elements provided on conductors arranged on a board. The board is formed with slits around the conductors to support the conductors elastically by parts of said board surrounded by the slits. The first and second connectors are brought into detachable abutment against each other to electrically connect to electric contacts and the electric contact elements of the first and second connectors. The electric contact elements of the second connector each are provided with at least one ridge, preferably plural ridges facing to the electric contact of the first connector. The ridges preferably extend in parallel with the direction of sliding movement of the electric contacts caused by the elastic support of the conductors. With this arrangement, after repeated connections between two connectors a great many times more than thousands, no foreign substance can adhere to the electric contact elements and no longer is there any incorrect electrical connection between the contacts.

8 Claims, 7 Drawing Sheets

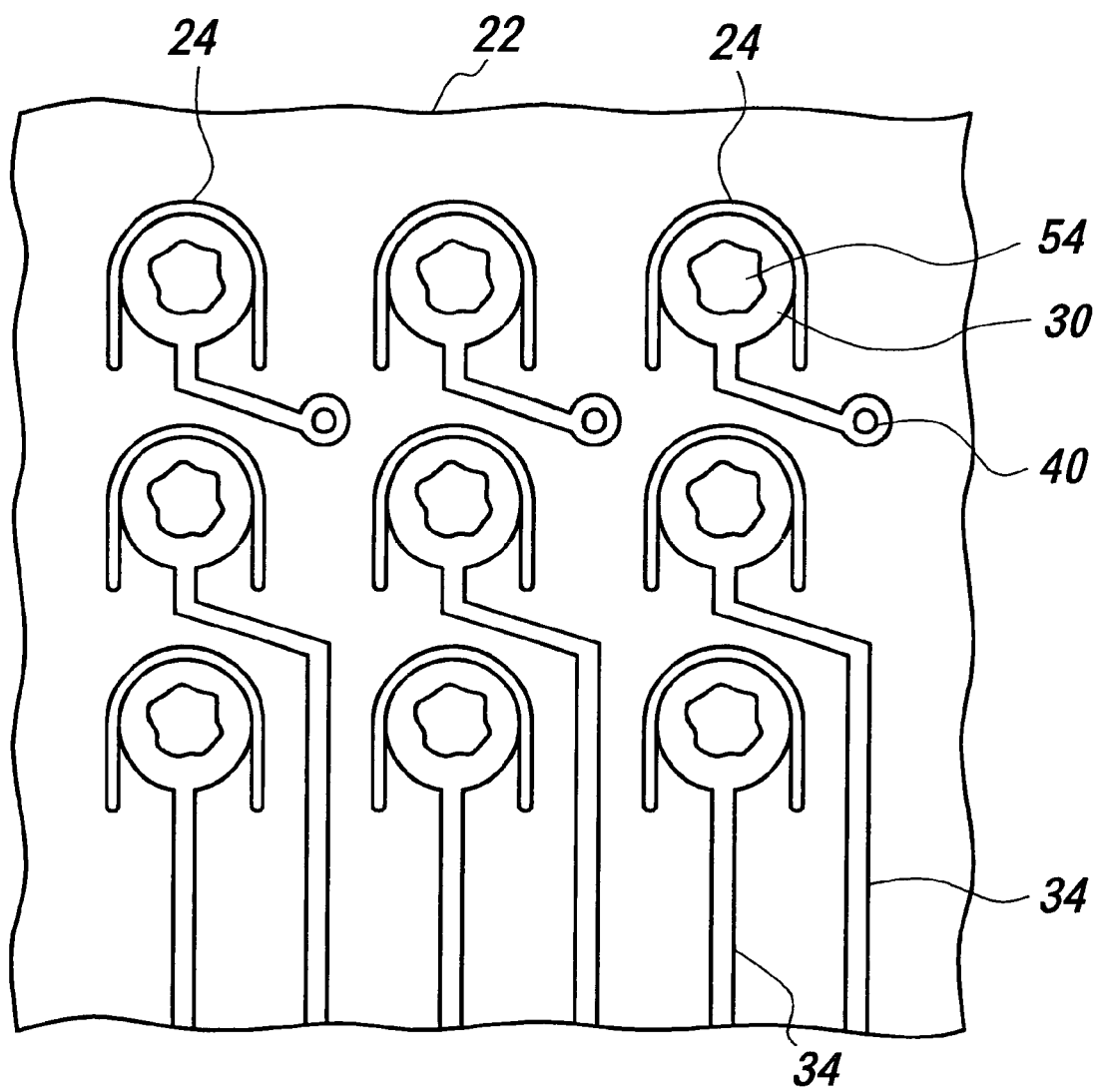

ELECTRICAL CONNECTORS ADAPTED TO REDUCE OR PREVENT ADHERENCE OF CONDUCTIVE MATERIAL TO CONTACT PORTIONS AS THE CONNECTOR

BACKGROUND OF THE INVENTION

This invention relates to an electrical connector adapted to be able to electrically connect a plurality of electric contacts and a plurality of electric contact elements at a time, and more particularly to an electrical connector including first and second connectors adapted to prevent any solder of the first connector from adhering to contact portions of the second connector.

We have ever proposed an electrical connector adapted to be able to electrically connect a plurality of electric contacts and electric contact elements at a time in U.S. patent application Ser. No. 09/366,832 filed Aug. 4, 1999, U.S. Pat. No. 6,220,871. The proposed electrical connector will be explained with reference to FIG. 6.

Referring to FIG. 6, the electrical connector 60 includes a first connector 10 (Ball Grid Array or BGA) and a second connector 50 (which is a socket connector to be connected to BGA elements or the like). When the first and second connectors 10 and 50 are brought into detachable abutment against each other, a plurality of electric contacts 12 made of solder in the form of spherical protrusions provided on one surface of the connector plate 11 of the first connector 10 are electrically connected to a plurality of electric contact elements 52 provided on one surface of the board 22 of the second connector 50. The first and second connectors 10 and 50 are detachably connected to each other with the aid of a plug and socket mechanism (not shown).

The connector plate 11 of the first connector 10 is made of a ceramic or hard resin substrate or board having a rigidity, on one surface of which are provided a plurality of electric contacts 12 of solder (PbSn) in the form of spherical protrusions. These electric contacts 12 are formed by reflow-soldering solder balls arranged on lands of a hard resin board.

The plurality of electric contact elements 52 are provided on one surface of the board 22 so as to be electrically connected to the electric contacts 12 of the first connector 10. As shown in FIG. 6, the electric contact elements 52 are provided on conductors 26 on the board 22 made of a flexible printed card (FPC) or the like which is formed with U-shaped slits 24 around the conductors 26 to elastically support the electric contact elements 52 by small tongue-shaped pieces 36. With this construction, the elastic support of the electric contact elements accommodates any differences in height between the electric contacts 12 of the first connector 10. The electric contact elements are treated with a surface treatment such as gold plating because they are electrically contacting portions.

The second connector 50 is used for inspecting the first connector 10 so that the electrical contact therebetween amounts often to several thousand times or more. Consequently, the electrical connector of this type suffers from the following disadvantages.

Referring to FIG. 7, when the electric contacts 12 of the first connector 10 and the electric contact elements 52 of the second connector 50 have been contacted with each other several hundred times, the solder (PbSn) forming the electric contacts 12 tends to adhere (as shown at 54) to the treated surfaces of the electric contact elements such as plated surfaces with gold, causing incorrect contact therebetween.

Owing to such an adherence of the solder 54 (FIG. 7) to the treated surfaces of the electric contact elements 52, removal of the adhered solder therefrom is needed by the use of a brush every several hundred times or thousand times of the contact between the electric contacts and the electric contact elements. However, the removal of the adhered solder by brushing is not an easy matter if not impossible. In order to remove the adhered solder more completely, it is required to increase the times of the brushing operation, which also increases the man-hour of the operation of the electrical connector, resulting in increased cost of operation.

SUMMARY OF THE INVENTION

It is an object of the invention to provide an improved electrical connector which eliminates all the disadvantages of the prior art described above and which minimizes the adherence of solder or oxide impurities to treated surface layers of electric contact elements even after repeated contacts between electric contacts and the electric contact elements of first and second connectors more than several thousand times.

In order to accomplish the above object, in an electrical connector including a first connector having a connector plate and a plurality of electric contacts provided on one surface of said connector plate, and a second connector having a board and a plurality of electric contact elements provided on conductors arranged on said board, said board formed with slits around said conductors to support said conductors and the like elastically by parts of said board surrounded by said slits, said first and second connectors being brought into detachable abutment against each other to electrically connect said electric contacts and said electric contact elements of said first and second connectors, according to the invention said electric contact elements of the second connector each comprise at least one ridge having a sharp crest thereon facing to said electric contact of said first connector.

The ridge or ridges preferably extend in parallel with the direction in which the electric contact of the first connector slides on the electric contact element of the second connector.

The ridge or ridges preferably have sharp crests.

In a preferred embodiment, the ridge or ridges have a height of 0.1 mm to 0.2 mm from the surface of the electric contact element.

In one embodiment, the electric contact elements of the second connector each comprise a plurality of ridges thereon extending in parallel with the direction in which the electric contact of the first connector slides on the electric contact element of the second connector to form a wave shape.

The number of the ridges of one electrical contact element is decided in consideration of a positional deviation between the electric contact element and the mating electric contact of the first connector.

Preferably, the ridge or ridges are formed in a manner that after providing a protection covering layer on the conductors, the protection covering layer is formed with one slit or plural slits at a location corresponding to each of the conductors and the slit or slits are then plated with a metal to fill the slit or slits with the metal so as to form the electric contact element and further to form the ridge or ridges by continuing the plating with the metal.

The board of the second connector is preferably provided with at least one elastic material layer such as silicone on the opposite side of the conductors to ensure the elastic supporting of them.

The electrical connector according to the invention provides the following significant effects.

(1) According to the invention the projecting ridge or ridges are provided on the surfaces of the electric contact elements, thereby making it possible to remove or scratch off the solder adhered to the electric contact elements in the preceding contact operations between the electric contacts and the electric contact elements without requiring any other particular precaution.

(2) According to the invention the ridge or ridges extend in parallel with the sliding movement of the electric contacts of first connector so that the solder debris attached to the electric contact elements in preceding contact operations can be removed forwardly with more certainty.

(3) According to the invention the ridge or ridges can be easily formed by progressively plating with a metal in slits formed in a protection covering layer provided on conductors. In the event that the crests of the ridges have been worn off, the ridges can be reformed by plating with the metal to regain the initial function of the ridges.

The invention will be more fully understood by referring to the following detailed specification and claims taken in connection with the appended drawings.

BRIEF DESCRIPTION OF THE DRAWINGS

FIG. 7 is an enlarged plan view illustrating the second connector shown in FIG. 6 to which the solder debris have been adhered.

DESCRIPTION OF THE PREFERRED EMBODIMENTS

Figure 1:
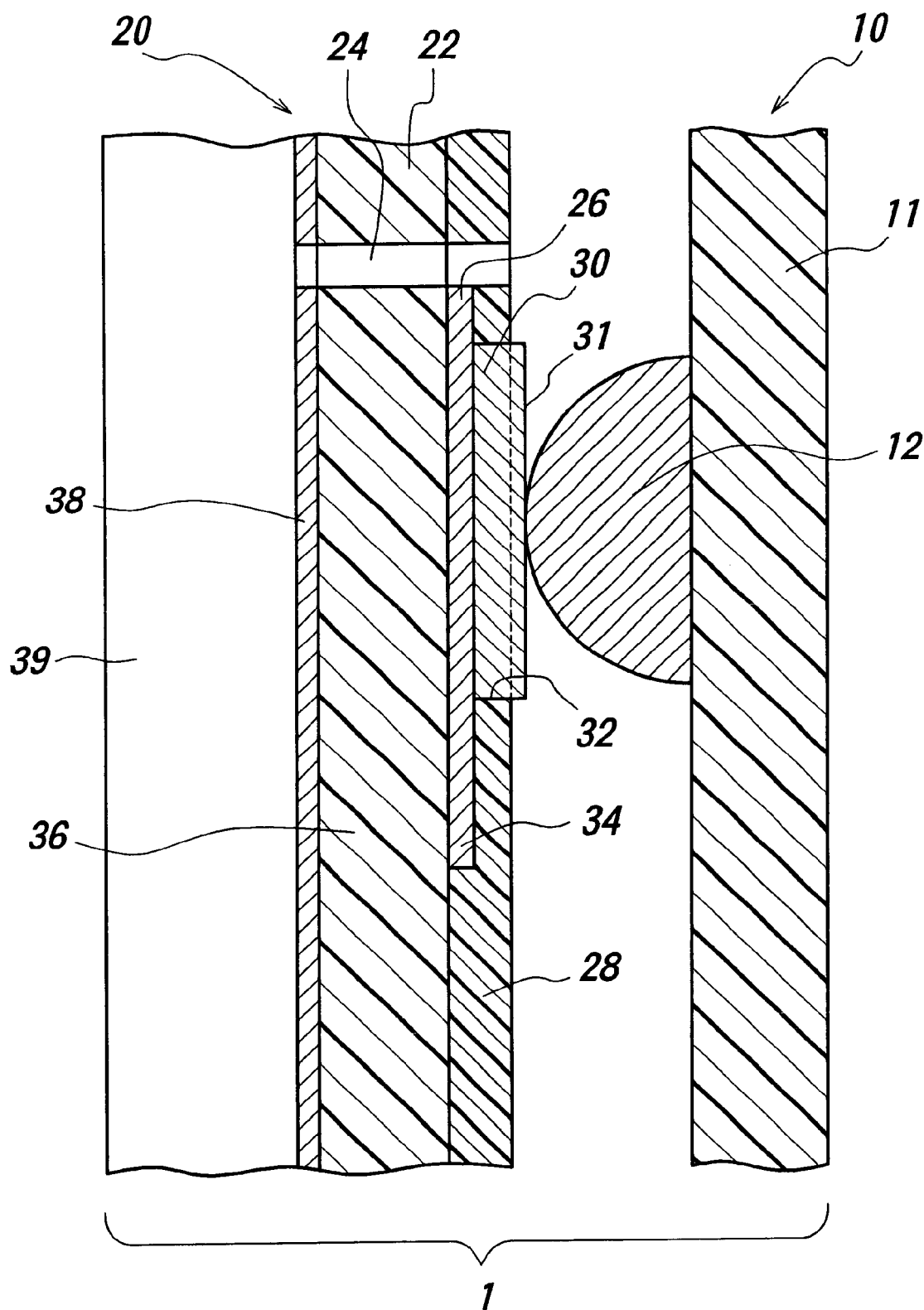
FIG. 1 is an enlarged partly longitudinal sectional view of the electrical connector according to the invention.

FIGS. 1 to 4 illustrate one preferred embodiment of the electrical connector 1 according to the invention. In the drawings, a first connector 10 includes a connector plate 11 made of a ceramic or hard resin substrate or board having a rigidity as in a conventional connector plate, and a plurality of electric contacts 12 of solder or the like in the form of hemispherical protrusions provided on one surface of the connector plate 11. A second connector 20 includes a connector plate or board 22 made of a soft resin or the like having an appropriate rigidity, a plurality of electric conductors 26 of disc-shaped metal layers on one surface of the board 22 facing to the electric contacts 12 of the first connector 10, a protection covering layer 28 of an insulating material provided on the board 22 on the same side as the electric conductors 26, a plurality of electric contact elements 30 provided on the electric conductors 26, and protrusions or ridges 31 in the form of a mountain range provided on the electric contact elements 30.

With the electric connector 1 including the first and second connectors 10 and 20, these connectors 10 and 20 are detachably connected to each other with the aid of a plug and socket mechanism in the conventional manner. Needless to say, on the connector plate 11 of the first connector 10 on the opposite side of the electric contacts 12 there are provided required wiring such as printed circuits electrically connected to the electric contacts 12 of the first connector 10.

The construction of the second connector 20 will be explained, which is a subject matter of the invention.

With the second connector according to the invention, the required electric conductors 26 are provided on the one surface of the board 22, for example, by treating a metal layer such as a copper foil previously provided thereon by means of the printed circuit forming method which is one of the board producing techniques.

Therefore, a great number of electric conductors 26 can be produced extremely inexpensively without requiring a large space. Also, lead wires 34 to be connected to the electric conductors 26 may of course be produced by the printed circuit forming method. In the case of lack of space for arranging the lead wires 34 on the board 22 due to the electric conductors 26 arranged in high density, the lead wires 34 may be formed on the rear surface of the board 22 so as to communicate with the electric conductors 26 through through-holes 40 (FIG. 3A) provided at appropriate locations in the board 22.

The electric contact elements 30 made of a conductive material superior in electric conductivity are provided at locations where electric conductors 26 electrically contact the electric contacts 12 of the first connector 10. The electric conductors 26 are plated with such a conductive material to form the electric contact elements 30 of the conductive material on the electric conductors 26. The material from which to form the electric conductors 26 may be any material, insofar as it is highly conductive, preferably, brass, beryllium copper, phosphor bronze and the like.

When the electric contact element 30 contacts the electric contact 12 of the first connector 10, a small amount of solder of the electric contact 12 tends to adhere to the electric contact element 30. In order to remove the adhered solder from the electric contact element 30, the element 30 is formed on its outer surface with at least one ridge 31 whose crest is preferably somewhat sharp. In this embodiment, there are provided a plurality of ridges 31 in the form of a mountain range viewed in section. The ridges 31 serve to remove the adhered solder as explained later.

The height of the ridges 31 may be determined so as to be able to remove the adhered solder from the electric contact element 30. The height of the ridges 31 of 0.1 mm to 0.2 mm is sufficient to remove the adhered solder. The number of the ridges is preferably plural in consideration of a positional deviation between the electric contact 12 of the first connector 10 and the electric contact element 30 of the second connector 20, and the like. With a plurality of ridges 31, they form a wave-shaped surface.

In view of the above function, the crests of the ridges 31 preferably extend in parallel with the direction of sliding movement of the electric contact 12 of the first connector 10 to ensure the removal of the solder forwardly which has adhered solder in the preceding contacts between the electric contact 12 and the electric contact element 30.

Figure 4A:
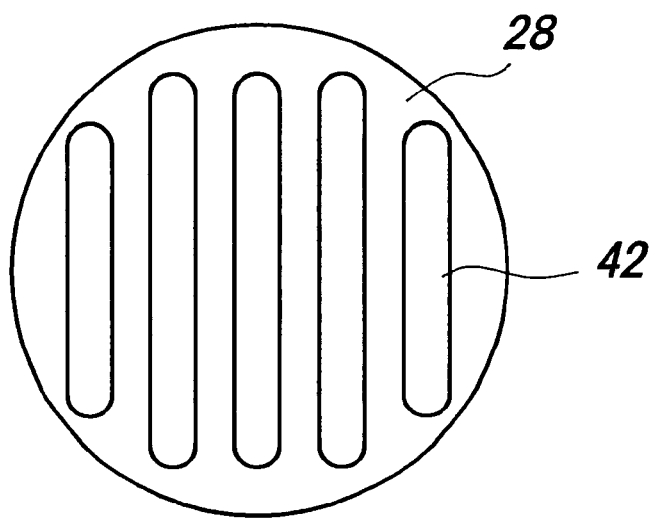
FIG. 4A is an enlarged plan view illustrating a part of the protection covering layer formed with slits in order to provide an electric contact element and ridges on a conductor according to the invention.
Figure 4B:
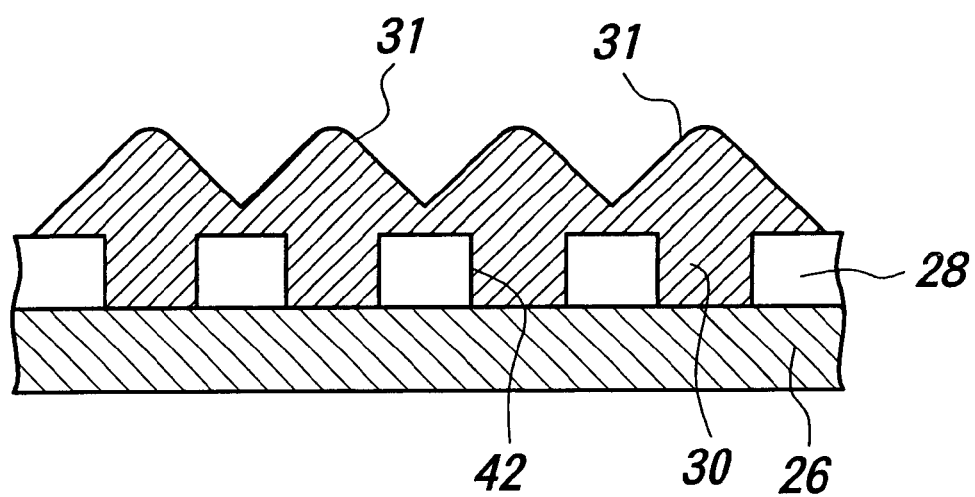
FIG. 4B is an enlarged sectional side view of an electric contact element and ridges formed by plating.

A method for forming the ridges 31 according to the invention will be explained with reference to FIGS. 4A and 4B. First, the protection covering layer 28 on the electric conductor 26 of the second connector 20 is formed with at least one slit, preferably a plurality of slits 42 extending in parallel with the sliding movement of the electric contact 12 of the first connector shown in FIG. 4A. The sliding movement of the electric contact 12 will be explained later. The slits 42 may be formed by, for example, the laser machining. Of course, the slit or slits pass completely through the protection covering layer 28 so as to reach the surface of the electric conductor 26 under the protection covering layer 28.

Thereafter, the formed slits 42 are progressively plated with the same material as that of the electric contact element 30 to an extent that the slits are filled with the plating metal to form the electric contact element. The plating with the plating metal is further carried out to form a plurality of ridges 31 which project higher than the surface of the protection covering layer 28 as shown in FIG. 4B. The number of ridges 31 is equal to the number of the slits 42 formed in the protection covering layer 28.

Figure 2:
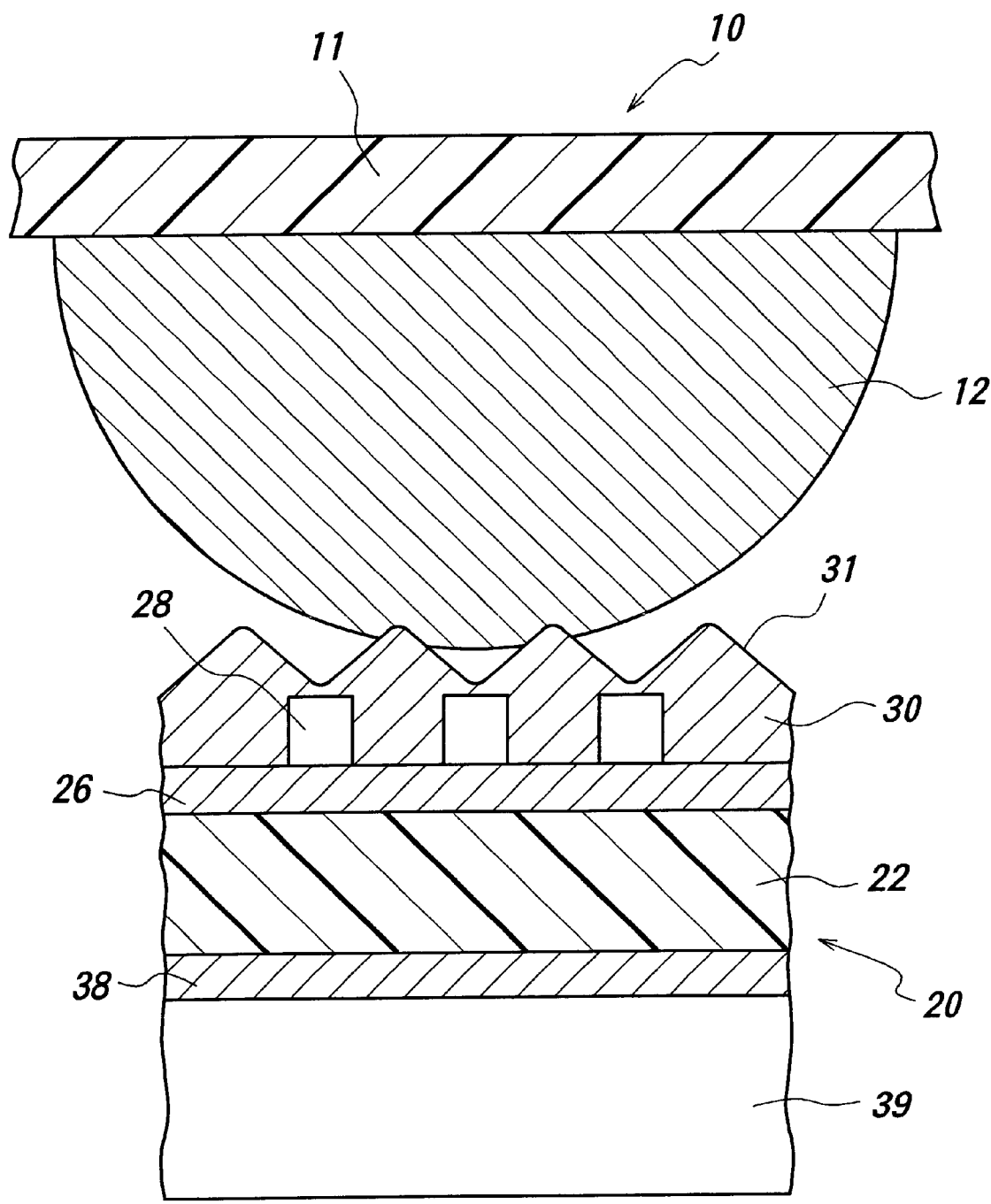
FIG. 2 is an enlarged partly cross-sectional view of the electrical connector according to the invention.

FIG. 2 illustrates the relation between the electric contact 12 of the first connector 10 and the thus formed ridges 31 of the second connector 20 in an enlarged partly sectional view.

Figure 3A:
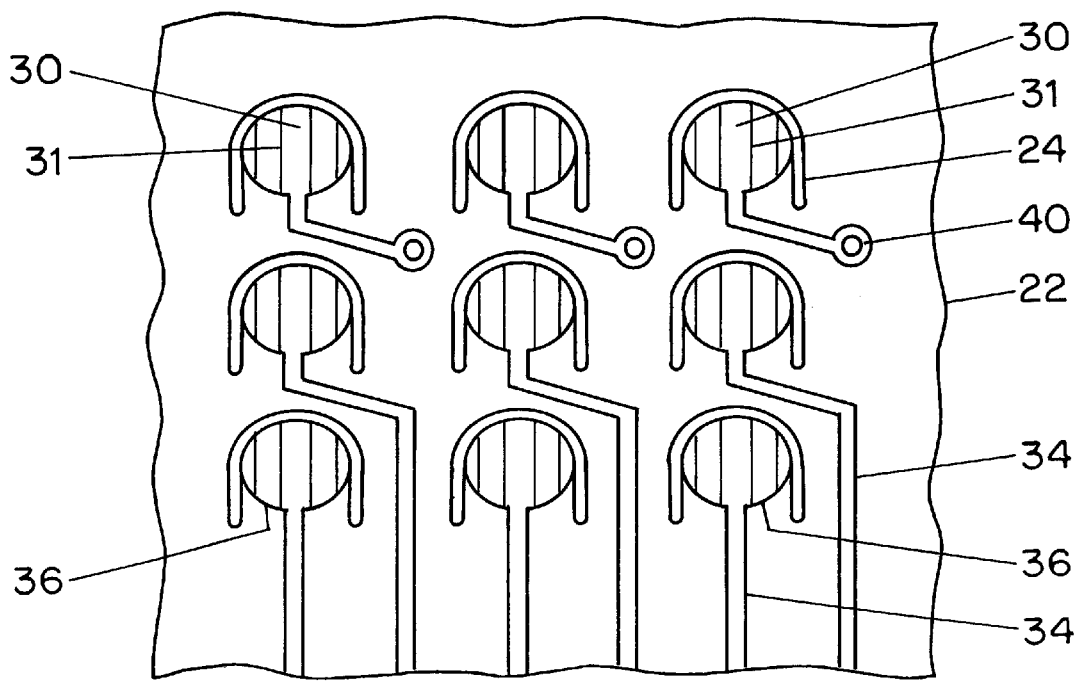
FIG. 3A is an enlarged plan view of the board of the second connector of the electrical connector shown in FIG. 1 viewed from the side of the first connector.
Figure 3B:
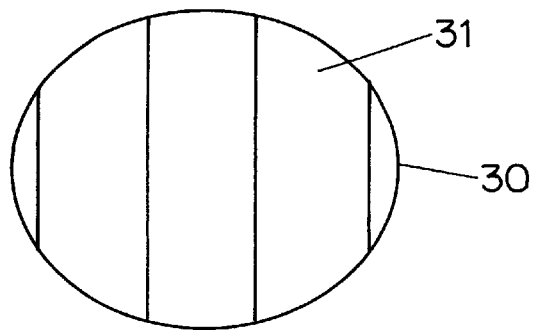
FIG. 3B is an enlarged plan view of the electric contact element of the second connector shown in FIG. 3A.
Figure 3C:
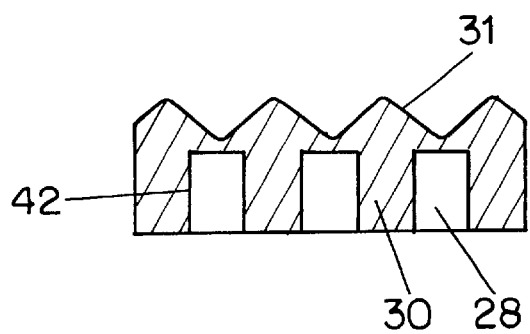
FIG. 3C is an enlarged sectional side view of the electric contact element of the second connector shown in FIG. 3A.

Returning to FIG. 1, the board 22 with the electric conductors 26 and the electric contact elements 30 is formed with inverted U-shaped slits 24 closely around the electric conductors 26 (FIG. 3A). These slits may be formed press-punching, laser machining, or the like in a simple manner. Because of the particular shape of the slits 24, the electric conductors 26 and the electric contact elements 30 are elastically supported by small tongue-shaped movable pieces 36 located inside the respective slits 24 in a cantilevered manner.

When the second connector 20 is brought into abutment against the first connector 10 so that the electric contact elements 30 abut against the electric contacts 12 of the first connector 10, the electric contact elements 30 compliant in the direction toward and away from the electric contacts 12 will elastically contact them to keep the stable electrical connection therebetween even if there are some differences of the electric contacts 12 in height.

In this manner, the electrical connection between the first and second connectors 10 and 20 is accomplished with high reliability. In this case, as the elasticity for the electric conductors 26 and the electric contact elements 30 depends upon the elasticity of the small tongue-shaped movable pieces 36 of the board 22, it is required for the board 22 of the non-rigid plastic material to have a rigidity to an extent such that a sufficient elasticity is given to the small tongue-shaped movable pieces 36.

As described above, when the first and second connectors 10 and 20 are connected to each other, the solder of the electric contacts 12 of the first connector 10 tends to adhere to the electric contact elements 30. According to the invention each of the electric contact elements 30 is formed with at least one ridge 31 so that the solder adhered to the electric contact element 30 in the preceding contacts between the electric contact 12 and the electric contact element 30 is scratched off or removed forwardly by sliding movement of the electric contact 12 on the electric contact element 30.

In order to realize such a sliding movement of the electric contact 10, according to the invention the board 22 of the second connector 20 is provided with an elastic material layer 39 such as silicone on a metal conductor 38 on the opposite side of the electric contact elements 30, and the board 22 is formed with the inverted U-shaped slits 24 around the electric conductors 26. The electric contact elements 30 supported by the small tongue-shaped movable pieces 36 formed by the U-shaped slits 24 are displaced onto the rear side of the board 22 of the second connector 20 by the urging force of the electric contacts 12 of the first connector 10, with the result that the contact positions between the electric contacts 12 and the Such a sliding movement will be explained herein after by referring to FIG. 5. When the first and second connectors 10 and 20 are connected to each other, the electric contact 12 of the first connector 10 (in the upper position in FIG. 5) is brought into contact with the electric contact element 30 of the second connector 20 at the point X (in the middle position in FIG. 5). The first connector 10 is further urged against the second connector 20, so that the small tongue-shaped movable piece 36 formed by the inverted U-shaped slit 24 is inclined downwardly about a point O shown in FIG. 5 with the aid of the resilient and the elasticity of the small tongue-shaped movable piece (36) and the elasticity of the elastic material layer 39 (in the lower position in FIG. 5).

Figure 5:
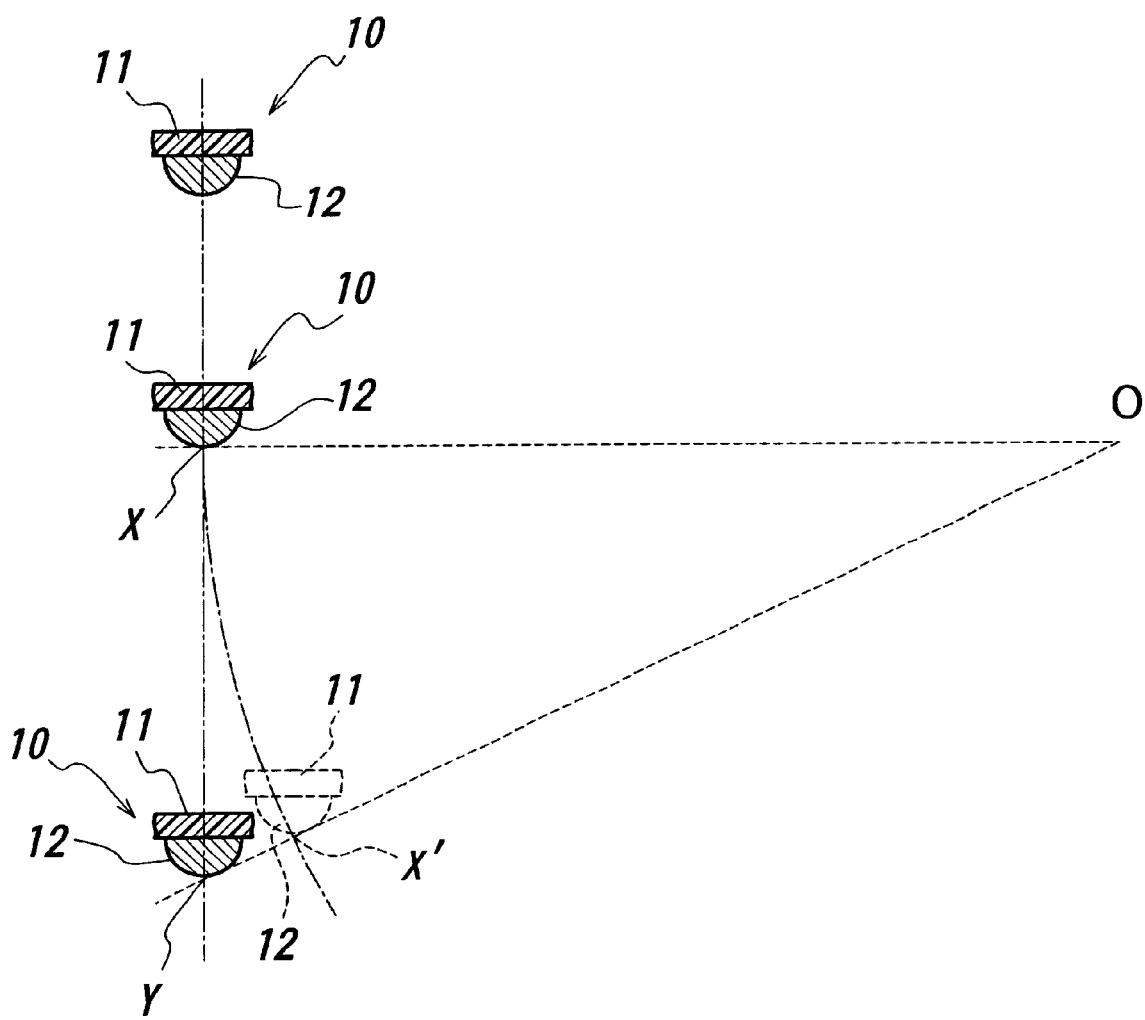
FIG. 5 is a schematic view for explaining the sliding movement of the electric contact of the first connector.
Figure 6:
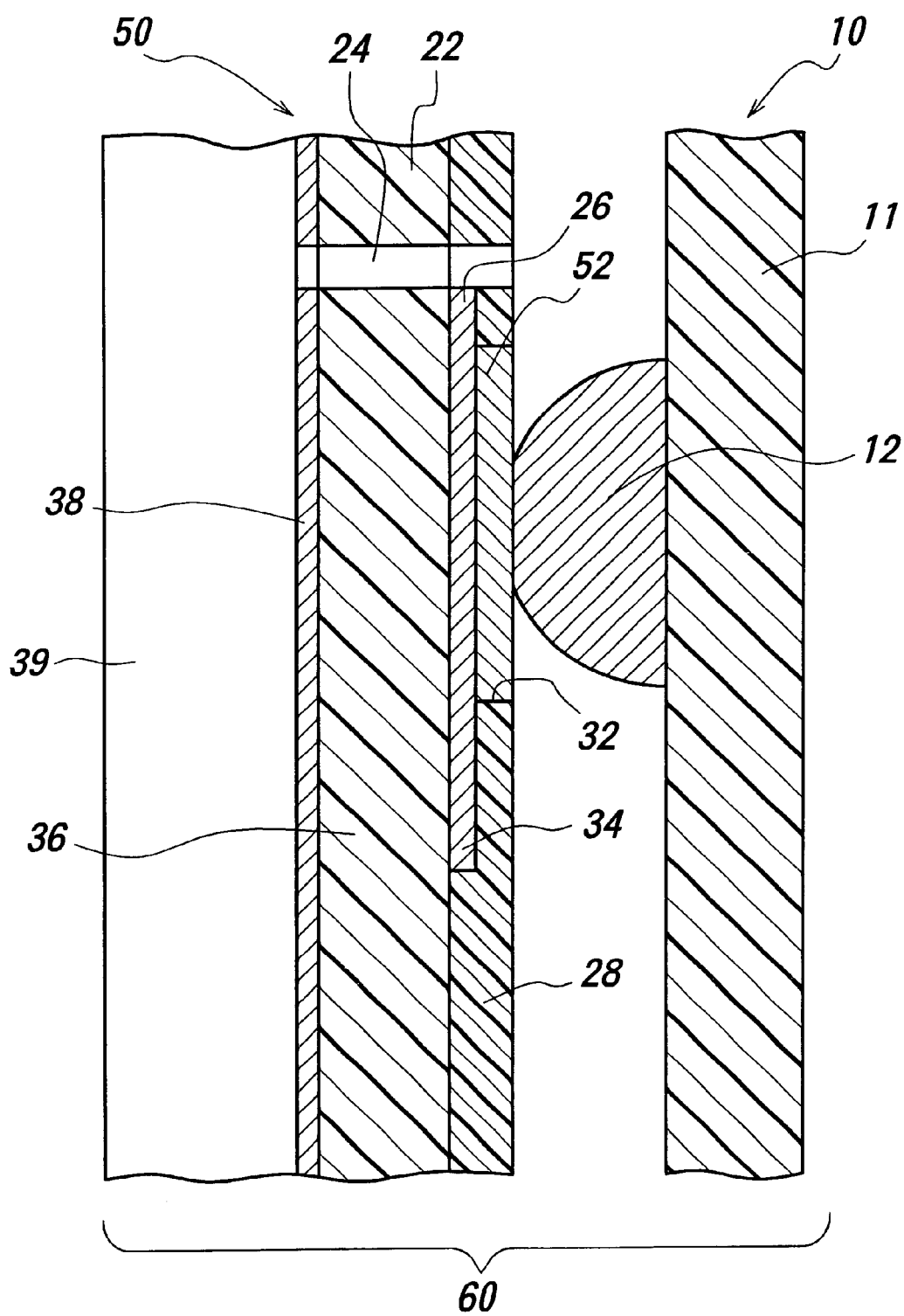
FIG. 6 is an enlarged partly longitudinal sectional view of the electrical connector of the prior art.

As a result, the electric contact element 30 is lowered downwardly so that the contact point X thereon is displaced to the point X' in FIG. 5. However, the electric contact 12 of the first connector 10 is moved vertically along a straight line without swaying because of the first connector 10 guided straightly in a socket mechanism. At this moment, the electric contact 12 contacts the electric contact element 30 at the point Y, which has been deformed downwardly. Accordingly, the electric contact 12 of the first connector 10 has been moved on the electric contact element 30 from the point X' to Y thereon, while being urged by a constant force. Such a movement is the sliding movement, and the moving direction is the sliding direction.

Consequently, the solder adhered to the electric contact element 30 in the preceding contacts between the electric contact 12 and the electric contact element 30 is removed with the aid of the sliding movement of the electric contact 12 on the electric contact element 30 with the ridges thereon.

While the invention has been particularly shown and described with reference to preferred embodiments thereof, it will be understood by those skilled in the art that the foregoing and other changes in form and details can be made therein without departing from the spirit and scope of the invention.

What is claimed is:

1. An electrical connector including a first connector having a connector plate and a plurality of electrical contacts provided on one surface of said connector plate, and a second connector having a board and a plurality of electric contact elements provided on conductors arranged on said board, said board formed with slits around said conductors to support said conductors and at least one elastic element of said board surrounded by said slits, said first and second connectors being brought into detachable abutment against each other to electrically connect said electric contacts and said electric contact elements of said first and second connectors, wherein said electric contact elements of said second connector each comprise at least one ridge having a sharp crest thereon facing said electric contact of said first connector, wherein said electric contact elements of said second connector are adapted to move from a first position to a second position vertically offset from said first position when said first connector and said second connector detachably abut against each other, wherein said movement of said electric contact elements removes at least a portion of a conductive material adhered to said electric contact elements of said second connector.

2. The electrical connector as set forth in claim 1, wherein said at least one ridge extends in parallel with the direction in which said electric contact of said first connector slides on said electric contact element of said second connector.

3. The electrical connector as set forth in claim 1, wherein said at least one ridge has a height of 0.1 mm to 0.2 mm from the surface of said electric contact element.

4. The electrical connector as set forth in claim 1, wherein said electric contact elements of the second connector each comprise a plurality of ridges thereon extending in parallel with the direction in which said electric contact of said first connector slides on said electric contact element to form a wave shape.

5. The electrical connector as set forth in claim 1, wherein the number of said ridges is decided in consideration of a positional deviation between the electric contact element of said second connector and the mating electric contact of the first connector.

6. The electrical connector as set forth in claim 1, wherein said at least one ridge is formed in a manner that after providing a protection covering layer on said conductors, said protection covering layer is formed with at least one slit at a location corresponding to each of said conductors and said slit is then plated with a metal to fill said slit with said metal so as to form said electric contact element and further to form a ridge by continuing the plating with the metal.

7. The electrical connector as set forth in claim 1, wherein said board of the second connector is provided with at least one elastic material layer such as silicone on the opposite side of said conductors to ensure the elastic supporting of them.

8. The electrical connector of claim 1, wherein said conductive material comprises solder.

* * * * *

UNITED STATES PATENT AND TRADEMARK OFFICE
CERTIFICATE OF CORRECTION

PATENT NO. : 6,450,821 B2
DATED : September 17, 2002
INVENTOR(S) : Otsuki et al.

It is certified that error appears in the above-identified patent and that said Letters Patent is hereby corrected as shown below:

<u>Title page, Item [54] and Column 1, line 4,</u>
Title, "AS" should read -- OF --

<u>Column 6,</u>
Line 7, "and the" should read -- and the electric contact elements 30 move and slide relative to each other. --

Signed and Sealed this

Eleventh Day of March, 2003

JAMES E. ROGAN
*Director of the United States Patent and Trademark Office*